US007183794B2

(12) United States Patent
DiTommaso

(10) Patent No.: US 7,183,794 B2
(45) Date of Patent: Feb. 27, 2007

(54) CORRECTION FOR CIRCUIT SELF-HEATING

(75) Inventor: Vincenzo DiTommaso, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/761,927

(22) Filed: Jan. 20, 2004

(65) Prior Publication Data

US 2005/0001651 A1 Jan. 6, 2005

Related U.S. Application Data

(60) Provisional application No. 60/484,561, filed on Jul. 1, 2003, provisional application No. 60/534,883, filed on Jan. 5, 2004.

(51) Int. Cl.
*H03K 19/003* (2006.01)

(52) U.S. Cl. ............................ 326/33; 326/32; 326/34

(58) Field of Classification Search ............ 326/31–34, 326/86, 90; 327/530, 538–541
See application file for complete search history.

(56) References Cited

U.S. PATENT DOCUMENTS 3,887,863 A 6/1975 Brokaw
4,349,778 A * 9/1982 Davis ......................... 323/314
4,618,816 A * 10/1986 Monticelli .................. 323/316
5,699,014 A * 12/1997 Haefner et al. ............. 330/253
6,122,497 A 9/2000 Gilbert
6,697,205 B2 * 2/2004 Cyrusian et al. .............. 360/68
6,714,081 B1 * 3/2004 Xu ............................ 330/296

OTHER PUBLICATIONS

B Gilbert, *A Point of Reference*, OCATE, Apr. 14, 1992, title page and pp. 1-23.

Analysis and Design of Analog Integrated Circuits, Fourth Edition, Paul Gray, Paul J. Hurst, Stephen H. Lewis and Robert G. Meyer, 2001, pp. 317-317, Section 4.4.3 Temperature-Insensitive Biasing, no month.

* cited by examiner

*Primary Examiner*—Anh Q. Tran
(74) *Attorney, Agent, or Firm*—Marger Johnson McCollom, PC

(57) ABSTRACT

Methods and apparatus for correcting for circuit self-heating replicate a thermal characteristic of a component that may be coupled to a bias circuit. A bias circuit may include replication component coupled to a reference cell. The replication component may be included in a feedback loop with the reference cell to improve accuracy.

18 Claims, 5 Drawing Sheets

CORRECTION FOR CIRCUIT SELF-HEATING

This application claims priority from U.S. Provisional Patent Application No. 60/484,561 filed Jul. 1, 2003 and U.S. Provisional Patent Application No. 60/534,883 filed Jan. 5, 2004 titled "Correction For Circuit Self-Heating", which are incorporated by reference.

BACKGROUND

Self-heating of devices in an integrated circuit (IC) is a well-known phenomenon. Devices that dissipate power will heat to a temperature that is determined largely by the thermal resistance of the device. Since many operating characteristics of a device are temperature dependent, self-heating affects device performance.

Two dominant trends in high-speed integrated circuit (IC) design are increasing device speed and decreasing device size. These have been achieved at the expense of higher current density and increased power density. Consequently, devices are operating at elevated temperatures that affect performance. Self-heating is a concern for all circuitry, but it is especially troublesome for precision bias circuitry. Bias circuitry is used to establish steady state or "quiescent" current and voltage levels in other circuitry. For example, in a transconductance cell, the gain is proportional to the bias current through the cell. If the bias circuit used to set the bias current through the gain cell is susceptible to self-heating effects, the performance of the gain cell is adversely impacted.

Bias circuits often include reference cells, which are used to generate reference voltages and currents. A type of reference cell known as a bandgap cell generates reference signals using forward-biased PN junctions, most usually, bipolar transistors having a reliable relationship between collector current ($I_C$) and base-emitter voltage ($V_{BE}$). For a given value of collector current, $V_{BE}$ is complimentary to absolute temperature (CTAT), i.e., has a negative slope when plotted against absolute temperature. Thus, a single transistor can be used to generate a CTAT reference voltage. However, a reference signal which is either stable with temperature or proportional to absolute temperature (PTAT) is more often needed.

Generating a PTAT signal is commonly accomplished by operating two bipolar transistors at different current densities. It is well known that for two transistors operating at different current densities, the difference in base-emitter voltages is given by:

$$\Delta V_{BE}=kT/q\ln(J1/J2) \qquad \text{Eq. (1)}$$

where k is Boltzman's constant, T is absolute temperature, q is the charge of an electron, and J1 and J2 are the current densities of the two transistors. (The expression kT/q is also known as the thermal voltage $V_T$.) Thus, the differential voltage is proportional to absolute temperature (PTAT). The current densities J1 and J2 are typically made unequal by operating the two transistors at the same current and making the emitter areas unequal. Alternatively, the same result could be obtained by setting the emitter areas equal and operating the transistors at unequal currents. Since this cell is based on the difference between the base-emitter voltages of two transistors, it is often referred to as a "$\Delta V_{BE}$" cell.

A stable reference signal can be generated by adding a PTAT signal to a CTAT signal which has a slope of the same magnitude but opposite sign. The classic bandgap circuit for generating a stable reference signal using this technique is shown in FIG. 1. This circuit is known as the Brokaw bandgap cell (named after its inventor, Paul Brokaw, as disclosed in U.S. Pat. No. 3,887,863 and Reissue 30,586).

The bases of transistors Q1 and Q2 are connected together, while the emitters are connected through resistor R2. Transistors Q1 and Q2 are loaded by resistors $R_{C1}$ and $R_{C2}$ which are typically selected to be equal. High gain amplifier A drives the bases of Q1 and Q2 so as to equalize the currents $I_{C1}$ and $I_{C2}$. The emitter areas A1 and A2 of transistors Q1 and Q2 are unequal, and since $I_{C1}=I_{C2}$, the transistors operate at different current densities J1 and J2. Thus, according to Eq. (1), $V_{BE}$ for the two transistors are unequal, and the difference voltage $\Delta V_{BE}$ appears across resistor R2. The current $I_P$ through R2 is therefore given by $I_P=\Delta V_{BE}/R2$. However, since the current through both transistors is equal, the current through R1 is twice the current through R2, and the voltage $V_{PTAT}$ across R1 is:

$$V_{PTAT}=2(R1/R2)V_T\ln(A2/A1) \qquad \text{Eq. (2)}$$

Thus the voltage across R1 is proportional to absolute temperature since $V_T$ is proportional to absolute temperature, i.e., $V_T=kT/q$.

Since $V_{BE}$ for Q1 is CTAT, the output voltage $V_{OUT}$ is the sum of a PTAT voltage across R1 and a CTAT voltage across the base-emitter junction of Q1. By proper selection of component values, the slopes of $V_{PTAT}$ and $V_{CTAT}$ can be made equal in magnitude, and since they are opposite in sign, $V_{OUT}$ will be stable with variations in temperature.

Another circuit used to generate a stable reference signal is shown in FIG. 2. This circuit is similar to that of FIG. 1, but it uses an active load to sense the difference in collector currents more directly. Transistors Q3 and Q4 form a current mirror which tends to force $I_{C1}$ and $I_{C2}$ to be equal. Any difference current flows into amplifier A which adjusts the base drive to equalize $I_{C1}$, and $I_{C2}$.

The circuits shown in FIGS. 1 and 2 both utilize feedback loops to increase accuracy. A prior art reference cell having multiple loops is shown in FIG. 3. Transistors Q11 and Q12 have emitter areas A1 and A2 respectively. Transistor Q15 supplies equal currents at equilibrium to transistors Q11 and Q12, whose collectors are connected to the emitter of Q15 through resistors R13 and R14 respectively. Current sources CS1 and CS2 set the bias currents through Q13 and Q14. Transistors Q11 and Q12 operate at different current densities J1 and J2, and therefore, different values of $V_{BE}$. As long as the current densities are maintained at constant values, $\Delta V_{BE}$ between Q11 and Q12 will be PTAT and shows up across R11. Thus, the current through R11, designated as $I_P$, is also PTAT.

Resistors R13 and R14 are used to sense the current through Q11 and Q12. Transistors Q13 and Q14 serve two functions. First, they sense the voltage difference at the collectors of Q11 and Q12. Additionally, transistors Q13 and Q14 clamp the voltages at the collectors of Q11 and Q12 respectively at one $V_{BE}$ above the common supply voltage line $V_{GND}$. This clamping effect reduces the power supply headroom required by transistors Q11 and Q12.

Transistors Q13 and Q15 and resistor R13 form a loop "A" which sets the voltage at the emitter of Q15, thereby maintaining the current through Q11 and Q12. Transistors Q14 and Q16 form a second loop "B" which drives the bases of Q11 and Q12 to balance the currents through the respective transistors. Because Q15 and Q16 are configured as emitter followers, they are both loadable as output nodes.

DRAWINGS

DETAILED DESCRIPTION

This patent encompasses multiple inventive principles. For convenience, the various inventions disclosed in this application may sometimes be referred to collectively or individually as "the present invention". It will be understood, however, that these inventions have independent utility and are independently patentable. In some cases, additional benefits are realized when some of the principles are utilized in various combinations with one another, thus giving rise to yet more patentable inventions.

These principles may be realized in numerous different embodiments. Only some preferred embodiments are described below. Although some specific details are shown for purposes of illustrating the preferred embodiments, other effective arrangements can be devised in accordance with the inventive principles of this patent. Thus, the inventive principles are not limited to the specific details disclosed herein.

Figure 1:
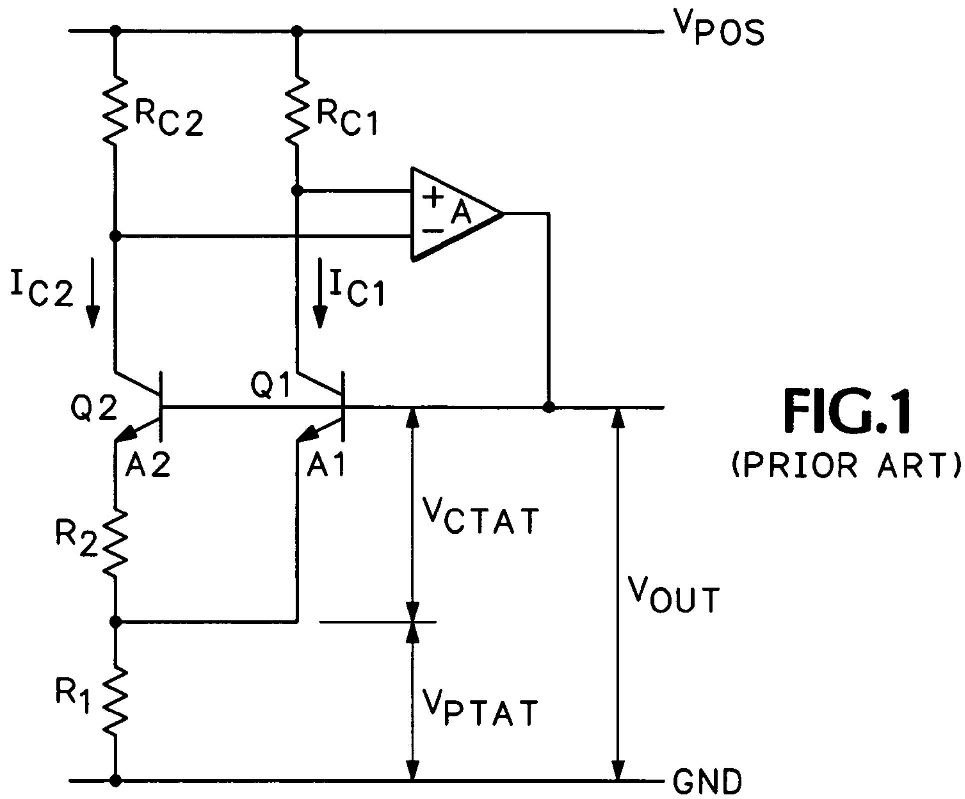
FIG.1 (PRIOR ART)
FIG. 1 illustrates a prior art reference cell.
Figure 2:
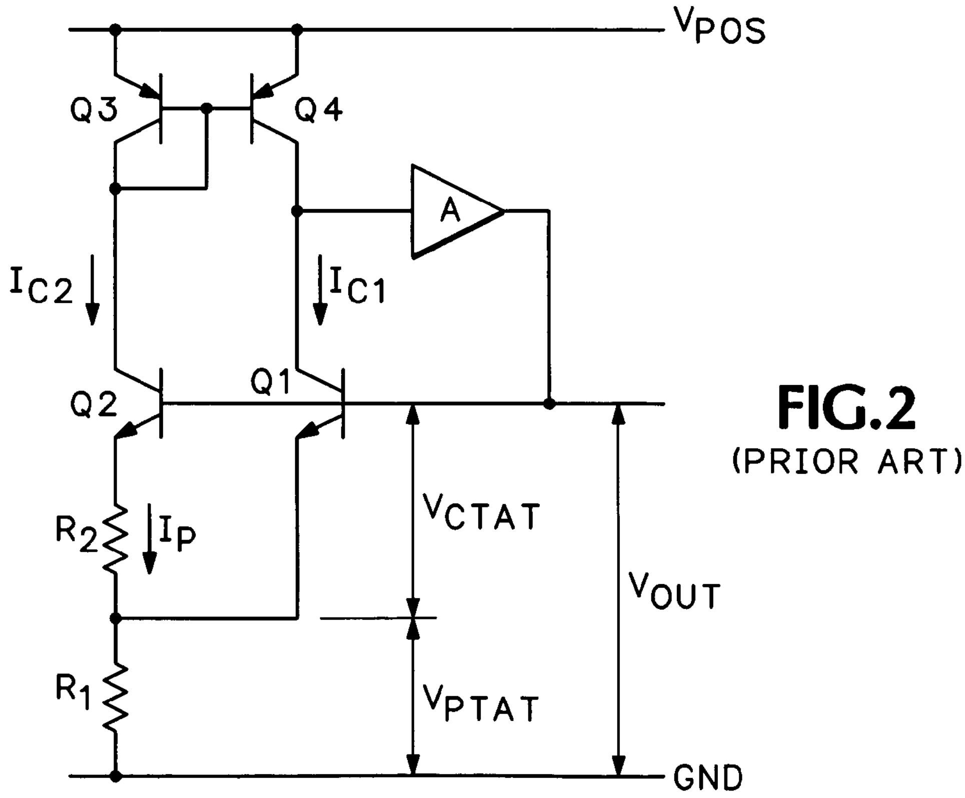
FIG.2 (PRIOR ART)
FIG. 2 illustrates another prior art reference cell.
Figure 3:
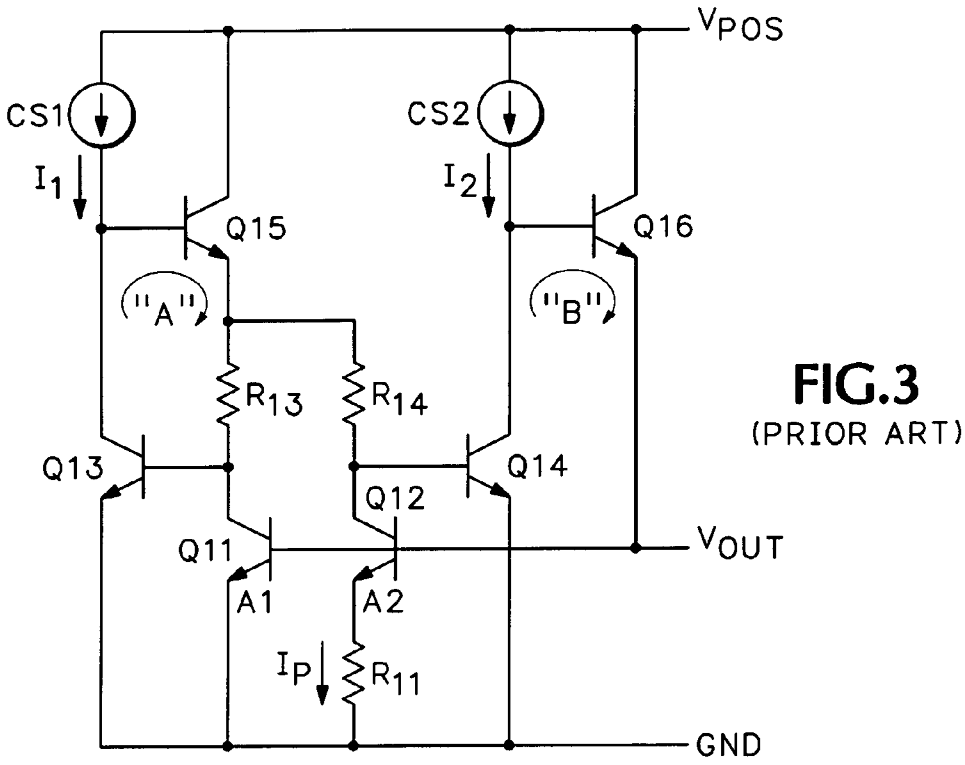
FIG.3 (PRIOR ART)
FIG. 3 illustrates another prior art reference cell having multiple loops.
Figure 4:
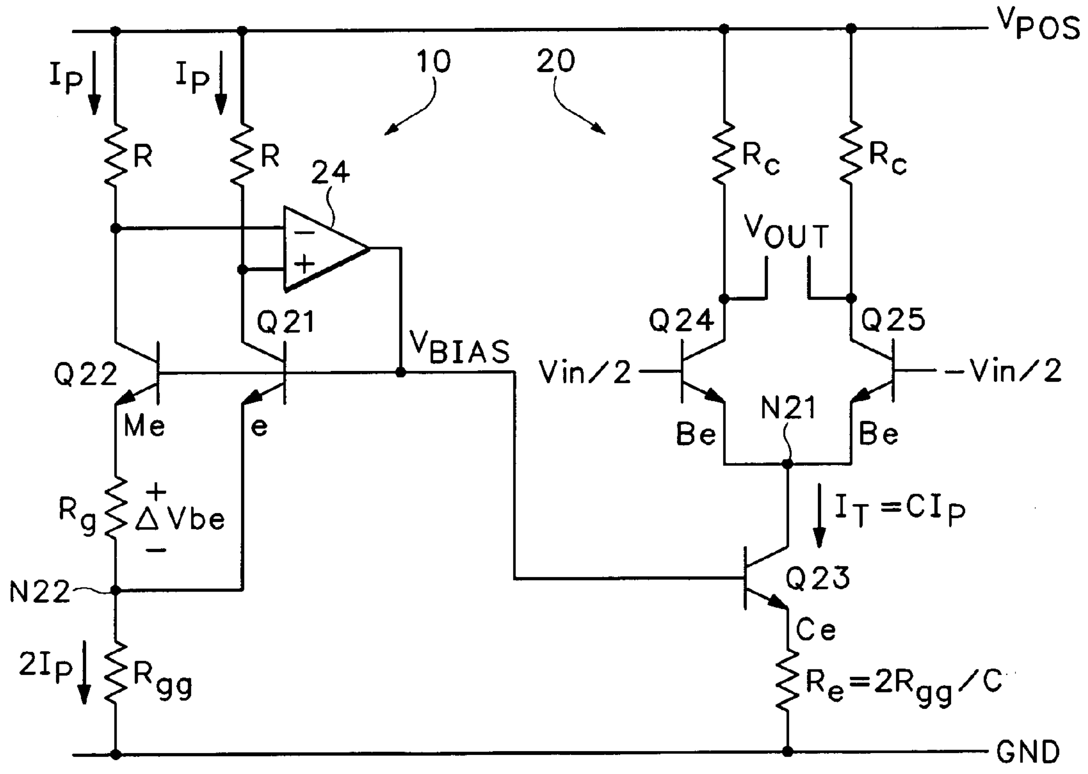
FIG. 4 illustrates a prior art combination of a reference cell and a gain cell.

To illustrate one of the inventive principles of this patent, a circuit self-heating problem will now be described in the context of a gain cell and an associated bias cell. The inventive principles, however, are not limited to use with circuits having this specific arrangement. Referring to FIG. 4, the gain cell 20 includes a differential pair of NPN transistors Q24 and Q25 having a common emitter connection at node N21. The collectors of Q24 and Q25 are loaded by resistors $R_C$ which are connected to a power supply $V_{POS}$. The differential pair is biased by a bias current (also called a "tail" current) $I_T$ which is generated at the collector of an NPN transistor Q23 and supplied to the differential pair at node N21. The emitter of Q23 is connected to ground GND through an emitter degeneration resistor Re, and the base of Q23 is driven by a bias voltage $V_{BIAS}$ which is generated by the bias cell 10. The differential input Vin to the gain cell is applied to the bases of Q24 and Q25 as Vin/2 and −Vin/2. The differential output Vout is taken at the collectors of Q24 and Q25. The emitter areas of Q24 and Q25 are "Be", and the emitter area of Q23 is "Ce", where "e" is a unit emitter area, "B" and "C" are coefficients determining the number of unit emitters.

The bias cell 10 is based on a classic $\Delta V_{BE}$ cell built around NPN transistors Q21 and Q22 and resistor Rg. The bases of Q21 and Q22 are connected together and provide the bias output signal $V_{BIAS}$. The emitter of Q21, which has an area of "e", is connected to a node N22. The emitter of Q22, which has an area of "Me", is connected to N22 through resistor Rg. Node N22 is connected to GND through another resistor Rgg. The collectors of Q21 and Q22 are connected to a power supply through load resistors R. An operational amplifier (op amp) 24 is arranged to drive the commonly connected bases of Q21 and Q22 so as to maintain the collectors of Q21 and Q22 at the same potential. This forces Q21 to conduct with a current density M times larger than Q22, thereby generating the $\Delta V_{BE}$ across Rg. The resulting current $I_P$ through Rg is proportional to absolute temperature (PTAT). The bias signal $V_{BIAS}$ drives Q23 in the gain cell so as to replicate the PTAT current in Q23 such that $I_T$ is also PTAT, and in this case, scaled by the factor C. The gain A of the gain cell is given by $A=-g_m Rc$ where the transconductance $gm=I_T/V_T$, and $I_T$ is the bias current through the gain cell. Therefore, $A=-I_T Rc/V_T$. So the gain is proportional to the bias current and inversely proportional to temperature. Since the bias current $I_T$ through the gain cell is PTAT, the gain remains stable versus overall circuit temperature and sheet resistance.

One problem with the arrangement described above, however, is that the power density of Q21 is greater than Q22, so the $\Delta V_{BE}$ generated across Rg differs from the expected value of $V_T \ln(M)$ due to the self-heating of Q21. Moreover, as the supply voltage varies, the power density in Q21 changes more dramatically than in Q22, thus causing the $\Delta V_{BE}$ across Rg to vary with changes in the supply voltage. These effects cause the gain of the differential pair to vary dramatically with changes in supply voltage.

Cascode Transistors

Figure 5:
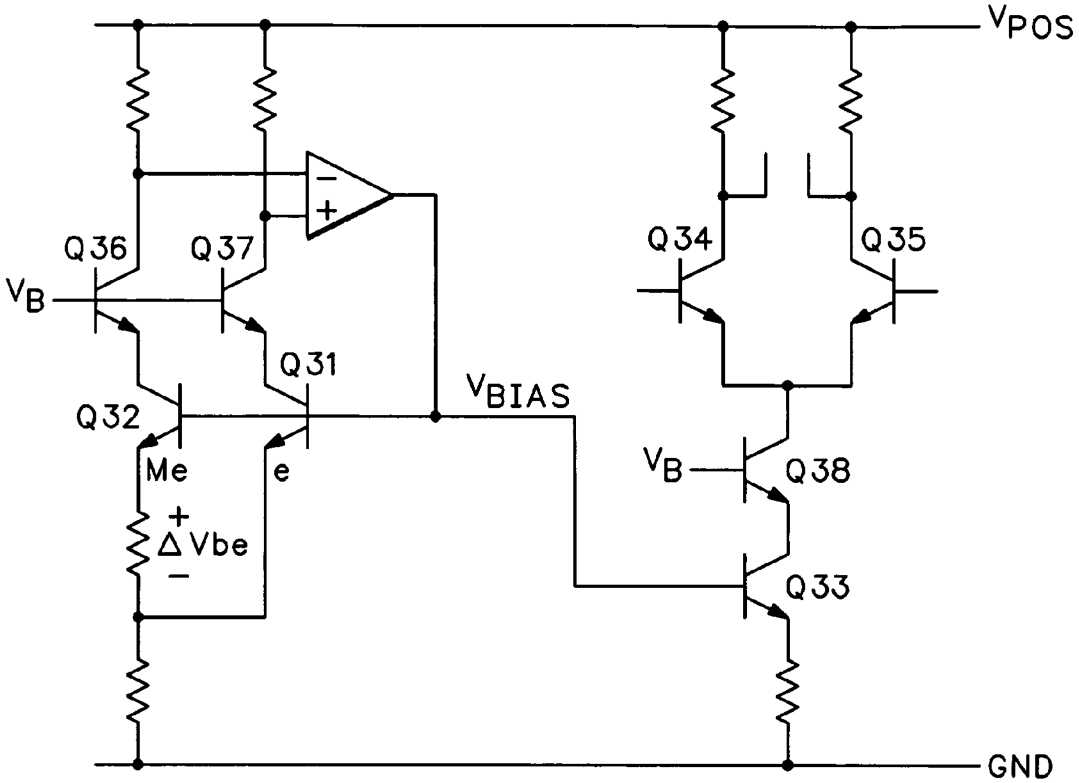
FIG. 5 illustrates an embodiment of a reference cell according to the inventive principles of this patent.

Some of the inventive principles of this patent relate to the use of cascode transistors in a reference cell. For example, in the circuit of FIG. 5, which illustrates an embodiment of a reference cell according to the inventive principles of this patent, cascode transistors Q36, Q37 and Q38 are coupled in series with the collectors of Q31, Q32 and Q33 and have their bases tied to an anchor voltage $V_B$. This reduces the transistor voltage swings, thereby maintaining the power dissipation in Q31, Q32 and Q33 at more constant levels as the supply voltage changes, albeit, at the expense of power supply headroom.

Replication Component

Figure 6:
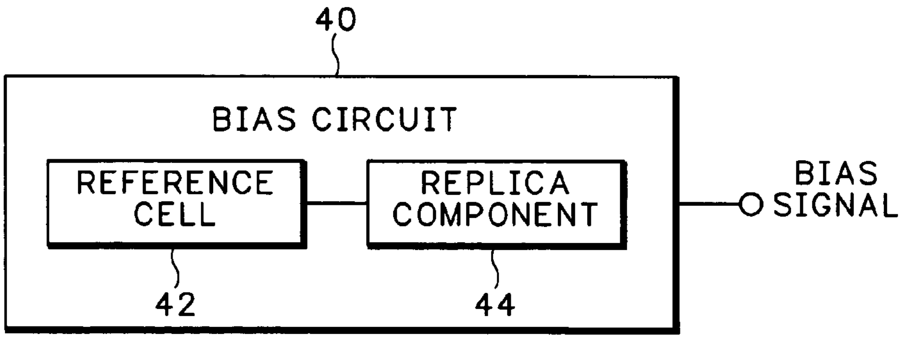
FIG. 6 illustrates an embodiment of a bias circuit according to the inventive principles of this patent.

Some additional inventive principles of this patent relate to replicating the thermal characteristics of a component that may be coupled to a bias circuit. FIG. 6 illustrates an embodiment of a bias circuit utilizing component replication according to the inventive principles of this patent. The bias circuit 40 generates a bias signal which will typically, but not necessarily be in the form of a voltage (electrical potential). The bias circuit includes a reference cell 42 which, for example, may be a bandgap cell, and a replication component 44. The replication component is coupled to the reference cell to adjust the bias signal by replicating a thermal characteristic of another component that may be coupled to the bias circuit. The replication component may be a separate component from the reference cell, or it may be coupled to the reference cell in such a way that it is an integral part of the reference cell.

Figure 7:
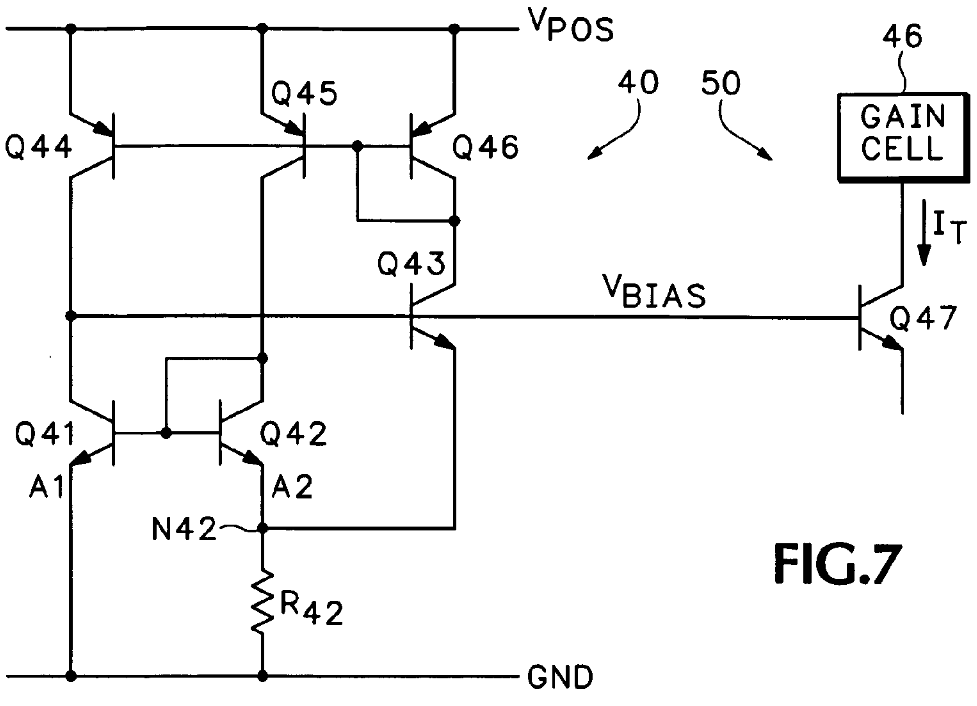
FIG. 7 illustrates another embodiment of a system and a bias circuit according to the inventive principles of this patent.

The embodiment of FIG. 6 may be implemented in countless different configurations. FIG. 7 shows just one example embodiment of a bias circuit illustrating some possible implementation details according to the inventive principles of this patent. The bias circuit 40 of FIG. 7 includes transistors Q41 and Q42 and resistor R42 arranged as a classic $\Delta V_{BE}$ cell. Transistor Q42 is arranged in a diode-connected configuration to support the bases of Q41 and Q42 at a defined potential.

The $\Delta V_{BE}$ cell is loaded by transistors Q44 and Q45 which, along with Q46, form a multiple-output current mirror. Transistors Q44 and Q45 mirror the current in Q46 which is diode-connected. The current through Q46 is set by the collector current in Q43. The base of Q43 is connected to the collector of Q41, and its emitter is connected to the emitter of Q42 at node N42. Thus, Q43 is included in a feedback loop that forces equal currents through Q41 and Q42. The bias signal $V_{BIAS}$ may be taken at the base of Q43, or at any other convenient point depending on the application.

Transistor Q43 is fabricated to match another transistor Q47 which may be coupled to the bias circuit 40. In this example, the other transistor Q47 is part of another circuit 50 and generates a tail current $I_T$ that biases a gain cell 46. Because transistors Q43 and Q47 are matched, Q43 experiences the same amount of self-heating as Q47. Therefore, as the self-heating in Q47 changes in response to varying operating conditions (e.g., supply voltage), the self-heating in Q43 adjusts the bias signal $V_{BIAS}$ to compensate for the self-heating in Q47.

Figure 8:
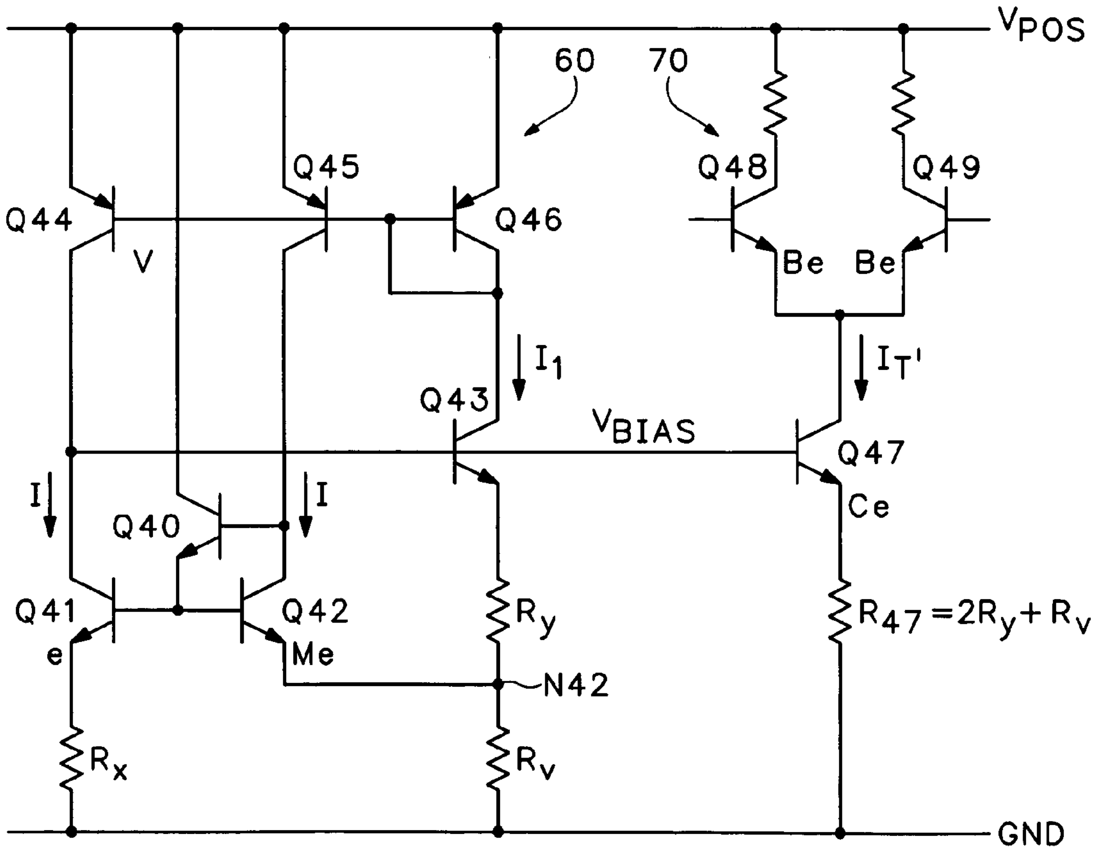
FIG. 8 illustrates another embodiment of a system and a bias circuit according to the inventive principles of this patent.

Numerous enhancements and refinements may be made to the embodiment of FIG. 7 according to the inventive principles of this patent. For example, FIG. 8 illustrates an embodiment in which two resistors Rx and Ry have been inserted in series with the emitters of Q41 and Q43, respectively. Adjusting the values of Rx and Ry allows the designer to control the amount of compensation the replication transistor contributes to $V_{BIAS}$, as will be explained in more detail below. In the embodiment of FIG. 8, the designators Me, Be and Ce indicate emitter areas relative to a unit emitter area "e". Transistor Q40 provides beta compensation. For purposes of illustration, the bias circuit 60 of FIG. 8 is show coupled to a gain stage 70 having a transconductance (gm) cell formed from Q48 and Q49, but the bias cell may be used with other types of circuits as well.

The loop equation for the loop including the $\Delta V_{BE}$ cell may be written as follows:

$$IRx+V_{BE1}=V_{BE2}+(I_1+I)Rv \quad \text{Eq. (3)}$$

where $V_{BE1}$ is the base-emitter voltage of Q41, and $V_{BE2}$ is the base-emitter voltage of Q42. Since $V_{BE1}-V_{BE2}=\Delta V_{BE}$, and $\Delta V_{BE}=V_T\ln(M)$, the equation may be rearranged as follows:

$$V_T ln(M)=V_{BE1}-V_{BE2}=IRv+I_1Rv-IRx \quad \text{Eq. (4)}$$

As a convenient example, assume Rx=2Rv−Rg and continue to rearrange:

$$V_T ln(M)=IRv+I_1Rv-I(2Rv-Rg) \quad \text{Eq. (5)}$$

$$V_T ln(M)=I_1Rv-IRv+IRg \quad \text{Eq. (6)}$$

Since I and $I_1$ are effectively equal, the $I_1$Rv and IRv terms cancel, and it becomes apparent that the current I is determined by the parameter Rg:

$$I=V_T ln(M)/Rg \quad \text{Eq. (7)}$$

Some further example values will now be discussed to provide more insight into the operation of the embodiment of FIG. 8, but the inventive principles not limited to any of these examples. If Rg<2Rv, then Rx would be negative, so assume Rg=2Rv. Rx then becomes zero. The voltage at the emitter of Q42 (node N42) is 2IRv (more exactly $(I+I_1)$Rv) and is PTAT. The voltage drop across Ry is $I_1$Ry. These two voltages added to $V_{BE2}$ are the bias voltage $V_{BIAS}$:

$$V_{BIAS}=I_1(RY+Rv)+IRv+V_{BE2} \quad \text{Eq. (8)}$$

Defining W=(Ry+Rv) and V=Rv provides a convenient way to understand how the various resistor values affect the relative amount of compensation the replication transistor contributes to $V_{BIAS}$. The factor V determines how much weight is given to the current I, whereas the factor W determines the amount of contribution from the compensation current $I_1$. Using a non-zero value for Rx provides additional flexibility in controlling the amount of compensation.

Thus, the bias current $I_T'$ is no longer PTAT, but instead is PTAT plus a correction factor that may cause the gm cell to maintain a constant gain as the supply voltage changes. Node N42 may be viewed as a summing node at which a PTAT current flowing through Q42 is summed with a compensation current flowing through Q43.

To reduce current consumption in the bias circuit, the emitter areas of Q43 and Q47 may be scaled. For example, assume the gain stage 70 requires a bias current of $I_T$=500 μA and the emitter area of Q47 is twice as large as Q43 (that is, C=2). Transistor Q43 can then be operated at 250 μA which is half the current of $I_T$. Assuming an emitter area ratio in the $\Delta V_{BE}$ cell of, for example M=14, Rg would then be determined by Rg=$V_T$ln(14)/250 μA=273Ω.

Figure 9:
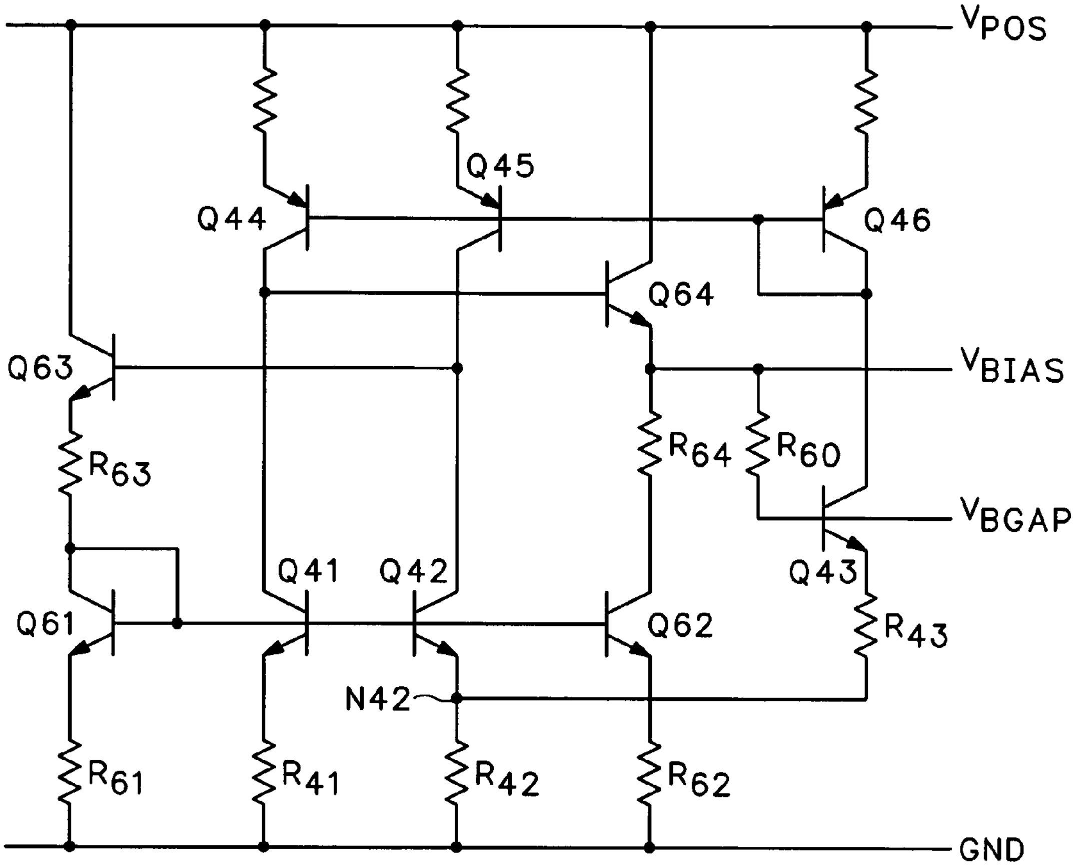
FIG. 9 illustrates another embodiment of a bias circuit according to the inventive principles of this patent.

FIG. 9 illustrates some additional refinements that may be made to an embodiment of a bias circuit according to the inventive principles of this patent. The embodiment of FIG. 9 again includes a $\Delta V_{BE}$ cell formed from Q41, Q42 and R42. Resistor R41 in series with the emitter of Q41 corresponds to Rx in the embodiment of FIG. 8. Transistors Q62 and Q64 and resistors R62 and R64 are arranged to provide an alternate point of access for the bias signal $V_{BIAS}$, and to clamp the collector voltage of Q41 so as to limit the voltage swing this point encounters as the supply voltage changes. Transistors Q61 and Q63 and resistors R61 and R63 are similarly arranged to clamp the collector voltage of Q42. Transistor Q61 provides a load for Q63.

If resistor R41 is removed, resistors R61 and R62 may also be removed. Resistors R61 and R62 adjust the current in Q61, Q63 and Q62, Q64. If R61=R62=R41, then the current through Q61, Q62, Q63, Q64 is $I_P$.

The replication component Q43 is again included in a feedback loop through multiple-output current mirror Q44, Q45, Q46. The collector of Q43 is connected to the diode connected transistor Q46, its emitter is connected to the emitter of Q42 through resistor R43, and its base is connected to the $V_{BIAS}$ point through a beta compensation resistor R60. The base of Q43 may be utilized as a bandgap reference signal $V_{GBAP}$.

Figure 10:
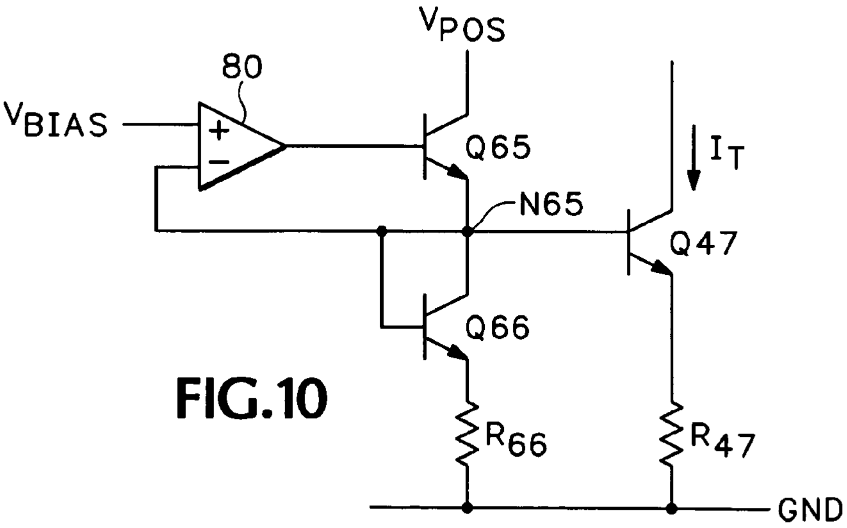
FIG. 10 illustrates an embodiment of a bias signal buffer circuit according to the inventive principles of this patent.

Although the bias signal $V_{BIAS}$ may be taken directly from the emitter of Q64, the bias signal may also be applied to a target circuit through a buffer amplifier arrangement as shown in FIG. 10. The bias signal $V_{BIAS}$ is applied to a unity gain operational amplifier (op amp) 80 which drives the base of emitter follower transistor Q65. Transistor Q65, in turn, drives node N65 which is loaded by diode-connected transistor Q66 and resistor R66. Node N65 may then be use to drive one or more current source transistors such as Q47 which is connected to GND through R47. In this example, the thermal characteristics of Q47 match those of Q43 in the bias circuit so that both devices experience the same self-heating effects as the supply voltage or other operating parameters vary. The bias current $I_T$ generated by Q47 may then be used to bias, for example, a gain cell. Since Q43 and Q47 suffer from the same thermal effects, the amplification of the gain cell can be made to remain constant even as the operating parameters change.

Some of the embodiments disclosed in this patent application have been described with specific signals implemented as current-mode or voltage mode signals, but the inventive principles also contemplate other types of signals, whether characterized as voltages, currents, or otherwise. Likewise, some semiconductor devices are described as being specifically NPN or PNP bipolar junction (BJT) type transistors, but other types of devices may be utilized. And although some of the specific circuit topologies have been shown for purposes of illustrating the preferred embodiments, numerous other structures are possible, and yet others can be devised in accordance with the inventive principles of this patent application. Power supplies have been illustrated as having positive polarity, but power supply configurations are possible. Some embodiments have been shown with a replica device in a closed feedback loop which generally improves accuracy, but the inventive principles are not limited to closed loop configurations.

Thus, the embodiments described herein can be modified in arrangement and detail without departing from the inventive concepts. Accordingly, such changes and modifications are considered to fall within the scope of the following claims.

The invention claimed is:

1. A bias circuit comprising:

a reference cell to generate a bias signal; and a first component coupled to the reference cell to adjust the bias signal by replicating a thermal characteristic of a second component that may be coupled to the bias circuit;

wherein the reference cell includes a first junction to operate at a first current density, a second junction coupled to the first junction to operate at a second current density that is substantially different than the first current density, and a first resistor coupled to the first junction at a summing node; and wherein the first component is coupled to the summing node.

2. A bias circuit according to claim 1 further comprising a current mirror coupled between the first component and the reference cell in a feedback loop arrangement.

3. A bias circuit according to claim 2 wherein the current mirror is arranged to load the reference cell.

4. A bias circuit according to claim 1 wherein the first component comprises a transistor.

5. A bias circuit according to claim 1 wherein the first component is coupled to the summing node through a second resistor.

6. A bias circuit according to claim 1 further comprising a clamping circuit coupled to the reference cell.

7. A method comprising:

generating a bias signal by operating a bandgap cell to generate a PTAT current in a first resistor;

generating a compensation current by operating a replica component under similar operating conditions to a component that may be coupled to the bias circuit;

adjusting the bias signal by coupling the compensation current to the first resistor, thereby summing the PTAT current and the compensation current.

8. A method according to claim 7 wherein the replica component is operated in a feedback loop with the bandgap cell.

9. A method according to claim 8 wherein operating the replica component in the feedback loop comprises mirroring current through the replica component into the bandgap cell.

10. A method according to claim 7 wherein the compensation current is coupled to the first resistor through a second resistor.

11. A method according to claim 7 further comprising clamping a voltage of the bandgap cell.

12. A system comprising:

a first circuit comprising a reference cell to generate a bias signal, and a first component coupled to the reference cell; and a second circuit coupled to the first circuit to receive the bias signal, the second circuit comprising a second component;

wherein the first component is arranged to adjust the bias signal by replicating a thermal characteristic of the second component;

wherein the reference cell includes a first junction to operate at a first current density, a second junction coupled to the first junction to operate at a second current density that is substantially different than the first current density, and a first resistor coupled to the first junction at a summing node; and wherein the first component is coupled to the summing node.

13. A system according to claim 12 further comprising a current mirror coupled between the first component and the reference cell in a feedback loop arrangement.

14. A system according to claim 12 wherein the first component is coupled to the summing node through a second resistor.

15. A system according to claim 12 wherein the first and second components have a matching thermal characteristic.

16. A bias circuit comprising:

bias means for generating a bias signal by operating a bandgap cell to generate a PTAT current in a first resistor; and replication means for generating a compensation current by operating a replica component under similar operating conditions to a component that may be coupled to the bias circuit;

wherein the compensation current is coupled to the first resistor, thereby summing the PTAT current and the compensation current.

17. A bias circuit according to claim 16 further comprising means for controlling the amount of compensation provided by the replication means.

18. A bias circuit according to claim 1 further comprising a third resistor coupled between the second junction and the first resistor at a common node.

* * * * *